United States Patent
Kelkar et al.

(10) Patent No.: US 11,662,198 B2
(45) Date of Patent: May 30, 2023

(54) OPTICAL ARRANGEMENT FOR AN INSPECTION APPARATUS

(71) Applicant: ASML Holding N.V., Veldhoven (NL)

(72) Inventors: Parag Vinayak Kelkar, Danbury, CT (US); Justin Lloyd Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 383 days.

(21) Appl. No.: 16/650,962

(22) PCT Filed: Sep. 14, 2018

(86) PCT No.: PCT/EP2018/074845
§ 371 (c)(1),
(2) Date: Mar. 26, 2020

(87) PCT Pub. No.: WO2019/063314
PCT Pub. Date: Apr. 4, 2019

(65) Prior Publication Data
US 2020/0271438 A1 Aug. 27, 2020

Related U.S. Application Data

(60) Provisional application No. 62/565,021, filed on Sep. 28, 2017.

(51) Int. Cl.
*G01B 11/06* (2006.01)
*G02B 5/30* (2006.01)
(Continued)

(52) U.S. Cl.
CPC .......... *G01B 11/0658* (2013.01); *G01B 11/24* (2013.01); *G02B 5/3041* (2013.01);
(Continued)

(58) Field of Classification Search
CPC .............. G01B 11/0658; G01B 11/24; G01B 2210/56; G02B 5/3041; G02B 27/283;
(Continued)

(56) References Cited

U.S. PATENT DOCUMENTS 2,403,731 A * 7/1946 MacNeille ........... G02B 27/142
359/485.02
4,890,901 A 1/1990 Cross, Jr.
(Continued)

FOREIGN PATENT DOCUMENTS

CN 101251718 A 8/2008
CN 104020642 A 9/2014
(Continued)

OTHER PUBLICATIONS

Miklos Erdelyi, Eric Rees, Daniel Metcalf, Gabriele S. Kaminski Schierle, Laszlo Dudas, Jozsef Sinko, Alex E. Knight, and Clemens F. Kaminski, "Correcting chromatic offset in multicolor super-resolution localization microscopy," Opt. Express 21, 10978-10988 (2013) (Year: 2013).*

(Continued)

*Primary Examiner* — Dominic J Bologna
(74) *Attorney, Agent, or Firm* — Sterne, Kessler, Goldstein & Fox P.L.L.C.

(57) ABSTRACT

An inspection apparatus, including: an optical system configured to provide a beam of radiation to a surface to be measured and to receive redirected radiation from the surface; and a detection system configured to measure the redirected radiation, wherein the optical system includes an optical element to process the radiation, the optical element including a Mac Neille-type multilayer polarizing coating configured to produce a reduced chromatic offset of the radiation.

20 Claims, 9 Drawing Sheets

(51) Int. Cl.
*G02B 27/28* (2006.01)
*G03F 7/20* (2006.01)
*G01B 11/24* (2006.01)

(52) U.S. Cl.
CPC ....... *G02B 27/283* (2013.01); *G03F 7/70616* (2013.01); *G03F 7/70625* (2013.01); *G03F 7/70641* (2013.01); *G01B 2210/56* (2013.01)

(58) Field of Classification Search
CPC ............. G03F 7/70616; G03F 7/70625; G03F 7/70641; G03F 7/70633; G03F 7/7065; G03F 9/7088
See application file for complete search history.

(56) References Cited

U.S. PATENT DOCUMENTS

| | | | | |
|---|---|---|---|---|
| 4,943,155 | A | * | 7/1990 | Cross, Jr. ............ G02B 27/1033 349/5 |
| 6,680,794 | B2 | | 1/2004 | McClay et al. |
| 7,839,506 | B2 | | 11/2010 | Straaijer et al. |
| 2002/0012168 | A1 | * | 1/2002 | Li ........................ H04N 9/3167 359/485.06 |
| 2003/0048423 | A1 | | 3/2003 | Aastuen et al. |
| 2006/0066855 | A1 | | 3/2006 | Boef et al. |
| 2009/0153825 | A1 | * | 6/2009 | Edart .................... G03F 9/7088 355/77 |
| 2019/0018176 | A1 | * | 1/2019 | Kuznetsov ............... G02B 5/30 |

FOREIGN PATENT DOCUMENTS

| | | | |
|---|---|---|---|
| JP | H02-502588 | A | 8/1990 |
| JP | H03-284705 | A | 12/1991 |
| JP | H08 286034 | A | 11/1996 |
| JP | 2006-145644 | A | 6/2006 |
| JP | 2006145644 | A * | 6/2006 |
| JP | 2006-301411 | A | 11/2006 |
| JP | 2006301411 | A * | 11/2006 |
| JP | 2007-294979 | A | 11/2007 |
| JP | 2013-015687 | A | 1/2013 |

OTHER PUBLICATIONS

Machine translation of JP2006145644A (Year: 2006).*
Machine translation of JP2006301411A (Year: 2006).*
International Search Report and Written Opinion of the International Searching Authority directed to related International Patent Application No. PCT/EP2018/074845, dated Jan. 3, 2019; 10 pages.
International Preliminary Report on Patentability directed to related International Patent Application No. PCT/EP2018/074845, dated Mar. 31, 2020; 7 pages.
Mouchart et al., "Modified MacNeille cube polarizer for a wide angular field," Optical Society of America, Applied Optics, vol. 28, No. 14, Jul. 15, 1989; pp. 2847-2853.
Perla et al., "Wide-angle, high-extinction-ratio, infrared polarizing beam splitters using frustrated total internal reflection by an embedded centrosymmetric multilayer," Optical Society of America, Applied Optics, vol. 46, No. 21, Jul. 20, 2007; pp. 4604-4612.
Kimura, Shinji "Polarizing Beam Splitters for Ultraviolet Lasers," Special Feature: Trends in Ultraviolet Optics, Optical and Electro-Optical Engineering Contact, vol. 48, No. 8, Aug. 20, 2010; 8 pages.

* cited by examiner

US 11,662,198 B2

OPTICAL ARRANGEMENT FOR AN INSPECTION APPARATUS

CROSS-REFERENCE TO RELATED APPLICATIONS

This application claims priority of U.S. Provisional Patent Application No. 62/565,021, which was filed on Sep. 28, 2017, and which is incorporated herein in its entirety by reference.

FIELD

The present description generally relates to an optical coating and/or reflective geometry.

BACKGROUND

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Further, metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s). Many of these metrology processes typically involve providing radiation incident onto various surfaces.

Once such example of metrology is alignment. As part of the patterning process, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. An alignment system of, e.g., a lithographic apparatus can be used to detect positions of the alignment marks (e.g., X and Y position) and to align the substrate using the alignment marks to help ensure accurate exposure from a patterning device. Alignment systems typically have their own illumination system and detection system.

Another example of metrology is level sensing. As part of the patterning process, a processing step may require a layer to be formed on the substrate at or near focus of the lithographic apparatus. Accordingly, it may be necessary to position the substrate relative to the focus and/or to adjust the focus near a certain level of the substrate, with a high degree of accuracy. So, a level sensor can be provided to determine the height and/or orientation of the substrate relative to the projection system. In an embodiment, this is done by projecting one or more beams of radiation at a tilt angle to the substrate and capturing the redirected radiation. The detected redirected radiation can be used to determine the height (e.g. in Z) and/or orientation (e.g., rotation about X or Y) of the substrate. Those results can then be used to control the position the substrate relative to the focus and/or to adjust the focus relative to the substrate. A level sensor typically has its own illumination system and detection system.

SUMMARY

Various apparatus (such as illumination systems of an inspection apparatus used to determine, e.g., alignment, height, overlay, etc.) can provide a range of radiation wavelengths for processing (e.g., for measurement). As further described below, a chromatic offset can occur between radiation using a first wavelength and radiation using a second different wavelength. Accordingly, there is provided one or more techniques to provide reduced chromatic offset in an apparatus that uses radiation at various different wavelengths.

In an embodiment, there is provided an inspection apparatus, comprising: an optical system configured to provide a beam of radiation to a surface to be measured and to receive redirected radiation from the surface; and a detection system configured to measure the redirected radiation, wherein the optical system comprises an optical element to process the radiation, the optical element comprising a MacNeille-type multilayer polarizing coating configured to produce a reduced chromatic offset of the radiation.

In an embodiment, there is provided a measurement method, the method comprising: providing a beam of radiation to a surface to be measured and receiving redirected radiation from the surface, wherein the radiation is processed using an optical element comprising a MacNeille-type multilayer polarizing coating configured to produce a reduced chromatic offset of the radiation; and detecting the redirected radiation to obtain a measurement.

In an embodiment, there is provided an inspection apparatus, comprising: an optical system configured to provide a beam of radiation to a surface to be measured and to receive redirected radiation from the surface; and a detection system configured to measure the redirected radiation, wherein the optical system comprises an optical element to process the radiation, the optical element comprising a first multilayer polarizing configured to provide a first chromatic offset in a first direction or orientation and a second multilayer polarizing coating configured to provide a second chromatic offset in a second different direction or orientation so that a combined chromatic offset of the first and second chromatic offsets is less the first and second chromatic offsets.

This section is for the purpose of summarizing and to briefly introduce an embodiment. Simplifications or omissions may be made to avoid obscuring the purpose of the section. Such simplifications or omissions are not intended to limit the scope of the present invention. Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form part of the specification, illustrate the present invention and, together with the description, further serve to explain the principles of the invention and to enable a person skilled in the relevant art(s) to make and use the invention.

Figure 1:
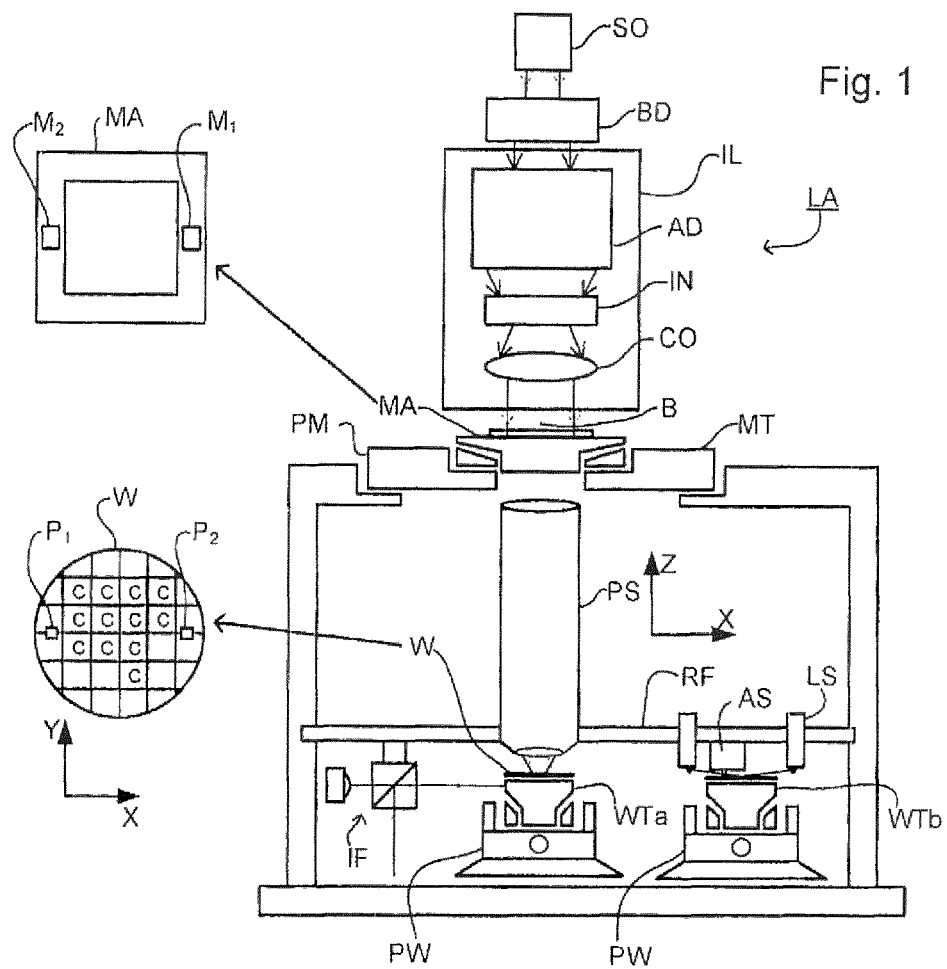
FIG. 1 depicts an embodiment of a lithographic apparatus.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

Before describing embodiments in detail, it is instructive to present an example environment in which embodiments may be implemented.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted minors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask). In an embodiment, where the apparatus is of a reflective type, the projection system may consist mainly of reflective optical elements (minors).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out.

To facilitate, e.g., control of the exposure of the substrate, a surface of substrate may be inspected to determine its height by an optical level sensor LS. With a known height, the relative position between the substrate and projection optical system can be controlled to, e.g., help place or maintain the substrate in the focus of the projection system.

Further, to facilitate, e.g., control of the exposure of the substrate, the position of alignment markers on the substrate and/or substrate table can be measured using an optical alignment sensor AS. With a known position of the alignment mark at the substrate and/or substrate table, the pattern from a patterning device can be relatively accurately placed on a desired location on the substrate.

In an embodiment, this height measurement and/or alignment measurement of a substrate and/or substrate table can take place at a measurement station prior to exposure of the substrate. This can enable a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the embodiments of the present invention.

Figure 2:
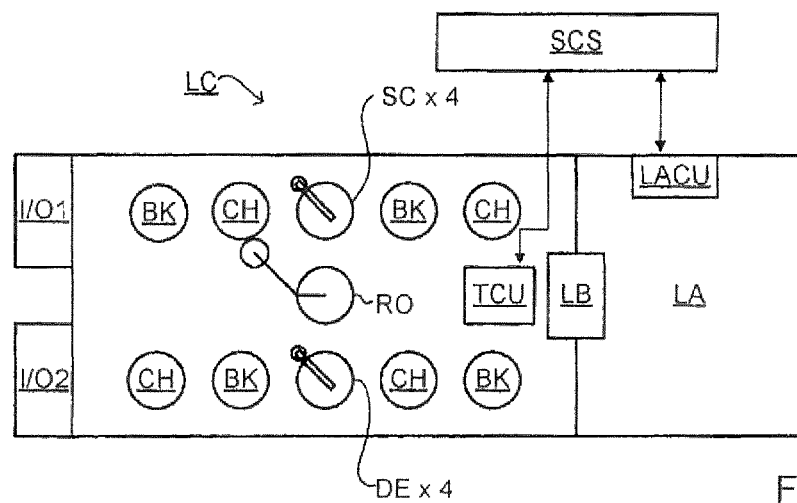
FIG. 2 depicts an embodiment of a lithographic cell or cluster.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order to design, monitor, control, etc. the patterning process (e.g., a device manufacturing process) that includes at least one patterning step (e.g., an optical lithography step), the patterned substrate can be inspected and one or more parameters of the patterned substrate are measured. The one or more parameters may include, for example, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on a substrate. There are various techniques for making measurements of the structures formed in the patterning process, including the use of a scanning electron microscope, image-based measurement or inspection tools and/or various specialized tools. A relatively fast and non-invasive form of specialized metrology and/or inspection tool is one in which a beam of radiation is directed onto a target on the surface of the substrate and properties of the redirected (diffracted/reflected) beam are measured. By comparing one or more properties of the beam before and after it has been scattered by the substrate, one or more properties of the substrate can be determined. This may be termed diffraction-based metrology or inspection.

Figure 3:
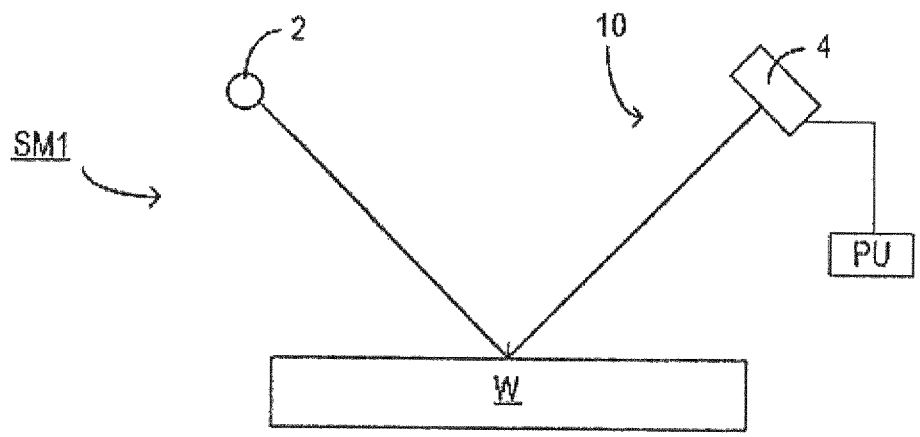
FIG. 3 schematically depicts an example inspection apparatus and metrology technique.
Figure 3:
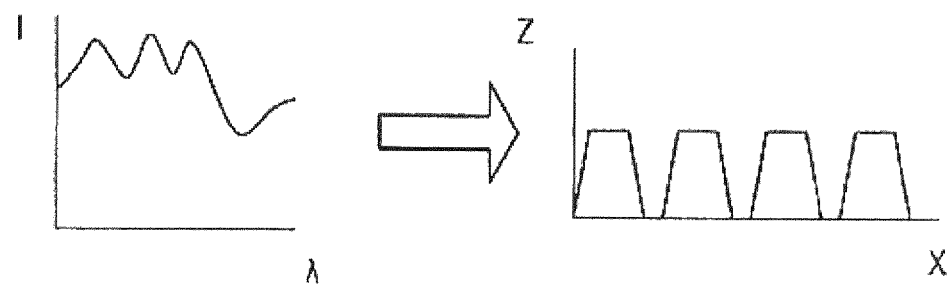

FIG. 3 depicts an example inspection apparatus (e.g., a scatterometer). It comprises a broadband (white light) radiation projector 2 which projects radiation onto a substrate W. The redirected radiation is passed to a spectrometer detector 4, which measures a spectrum 10 (intensity as a function of wavelength) of the specular reflected radiation, as shown, e.g., in the graph in the lower left. From this data, the structure or profile giving rise to the detected spectrum may be reconstructed by processor PU, e.g. by Rigorous Coupled Wave Analysis and non-linear regression or by comparison with a library of simulated spectra as shown at the bottom right of FIG. 3. In general, for the reconstruction the general form of the structure is known and some variables are assumed from knowledge of the process by which the structure was made, leaving only a few variables of the structure to be determined from the measured data. Such an inspection apparatus may be configured as a normal-incidence inspection apparatus or an oblique-incidence inspection apparatus.

Figure 4:
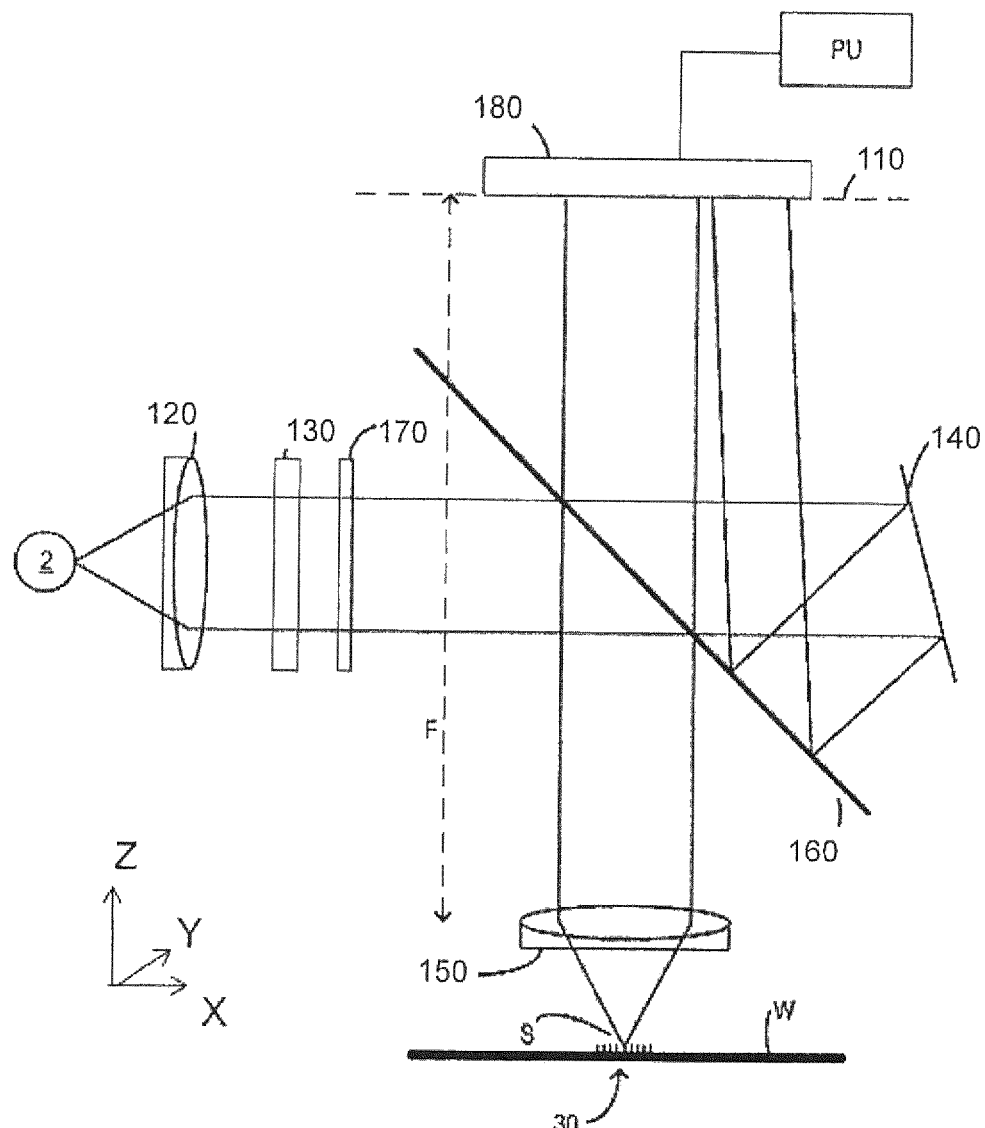
FIG. 4 schematically depicts an example inspection apparatus.

Another inspection apparatus that may be used is shown in FIG. 4. In this device, the radiation emitted by radiation source 2 is collimated using lens system 120 and transmitted through interference filter 130 and polarizer 170, reflected by partially reflecting surface 160 and is focused into a spot S on substrate W via an objective lens 150, which has a high numerical aperture (NA), desirably at least 0.9 or at least 0.95. An immersion inspection apparatus (using a relatively high refractive index fluid such as water) may even have a numerical aperture over 1.

The radiation redirected by the substrate W then passes through partially reflecting surface 160 into a detector 180 in order to have the spectrum detected. The detector 180 may be located at a back-projected focal plane 110 (i.e., at the focal length of the lens system 150) or the plane 110 may be re-imaged with auxiliary optics (not shown) onto the detector 180. The detector may be a two-dimensional detector so that a two-dimensional angular scatter spectrum of a substrate target 30 can be measured. The detector 180 may be, for example, an array of CCD or CMOS sensors, and may use an integration time of, for example, 40 milliseconds per frame.

A reference beam may be used, for example, to measure the intensity of the incident radiation. To do this, when the radiation beam is incident on the partially reflecting surface 160 part of it is transmitted through the partially reflecting surface 160 as a reference beam towards a reference minor 140. The reference beam is then projected onto a different part of the same detector 180 or alternatively on to a different detector (not shown).

One or more interference filters 130 are available to select a wavelength of interest in the range of, say, 405-790 nm or even lower, such as 200-300 nm. The interference filter may be tunable rather than comprising a set of different filters. A grating could be used instead of an interference filter. An aperture stop or spatial light modulator (not shown) may be provided in the illumination path to control the range of angle of incidence of radiation on the target.

The detector 180 may measure the intensity of redirected radiation at a single wavelength (or narrow wavelength range), the intensity separately at multiple wavelengths or integrated over a wavelength range. Furthermore, the detector may separately measure the intensity of transverse magnetic- and transverse electric-polarized radiation and/or the phase difference between the transverse magnetic- and transverse electric-polarized radiation.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may be etched into or on the substrate (e.g., into one or more layers on the substrate). The pattern (e.g., of bars, pillars or vias) is sensitive to change in processing in the patterning process (e.g., optical aberration in the lithographic projection apparatus (particularly the projection system PS), focus change, dose change, etc.) and will manifest in a variation in the printed grating. Accordingly, the measured data of the printed grating is used to reconstruct the grating. One or more parameters of the 1-D grating, such as line width and/or shape, or one or more parameters of the 2-D grating, such as pillar or via width or length or shape, may be input to the reconstruction process, performed by processor PU, from knowledge of the printing step and/or other inspection processes.

Figure 5:
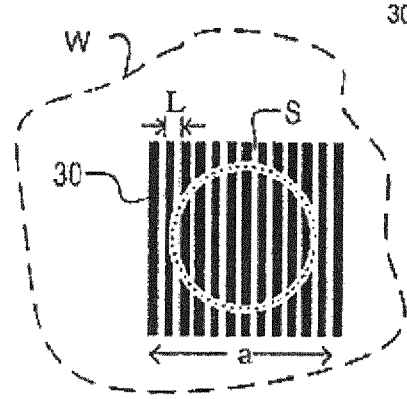
FIG. 5 illustrates the relationship between an illumination spot of an inspection apparatus and a metrology target.

FIG. 5 illustrates a plan view of a typical target 30, and the extent of illumination spot S in the apparatus of FIG. 4. To obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target in other words is 'underfilled' by the illumination, and the diffraction signal is essentially free from any signals from product features and the like outside the target itself. The illumination arrangement 2, 120, 130, 170 may be configured to provide illumination of a uniform intensity across a back focal plane of objective 150. Alternatively, by, e.g., including an aperture in the illumination path, illumination may be restricted to on axis or off axis directions.

In addition to measurement of a parameter by reconstruction, diffraction-based metrology or inspection can be used in the measurement of asymmetry of features in product and/or resist patterns. A particular application of asymmetry measurement is for the measurement of overlay, for example, but other applications are also known. In this case, the target 30 typically comprises one set of periodic features superimposed on another. For example, asymmetry can be measured by comparing opposite parts of the diffraction spectrum from the target 30 (for example, comparing the −1st and +1$^{st}$ orders in the diffraction spectrum of a periodic grating). The concepts of asymmetry measurement using the instrument of FIG. 3 or FIG. 4 are described, for example, in U.S. patent application publication US2006-066855, which is incorporated herein in its entirety by reference. Simply stated, while the positions of the diffraction orders in the diffraction spectrum of the target are determined only by the periodicity of the target, asymmetry in the diffraction spectrum is indicative of asymmetry in the individual features which make up the target. In the instrument of FIG. 4, where detector 180 may be an image sensor, such asymmetry in the diffraction orders appears directly as asymmetry in the pupil image recorded by detector 180. This asymmetry can be measured by digital image processing in unit PU, and calibrated against known values of overlay.

Figure 6A:
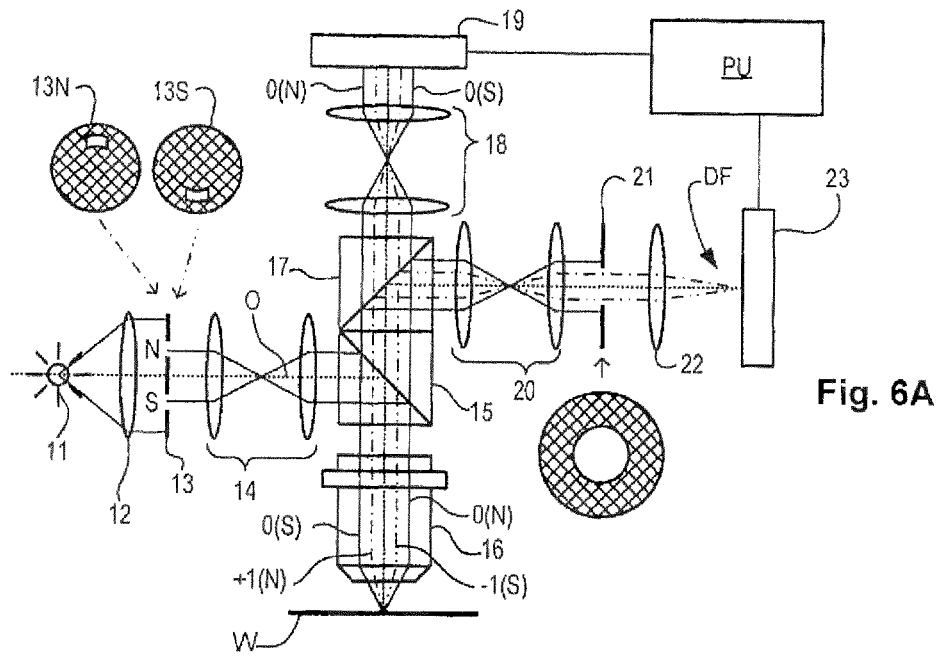
FIG. 6A depicts a schematic diagram of an inspection apparatus configured to measure a target.

A further inspection apparatus suitable for use in embodiments is shown in FIG. 6A. A target T and diffracted rays of measurement radiation used to illuminate the target are illustrated in more detail in FIG. 6B. The inspection apparatus illustrated is of a type known as a dark field metrology apparatus. The inspection apparatus may be a stand-alone device or incorporated in either the lithographic apparatus LA, e.g., at the measurement station, or the lithographic cell LC. An optical axis, which has several branches throughout the apparatus, is represented by a dotted line 0. In this apparatus, radiation emitted by source 11 (e.g., a xenon lamp) is directed onto substrate W via optical element 15 by an optical system comprising lenses 12, 14 and objective lens 16. These lenses are arranged in a double sequence of a 4F arrangement. A different lens arrangement can be used, provided that it, e.g., provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis radiation from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode will interfere with the desired measurement signals.

Figures 6B, 6C, 6D:
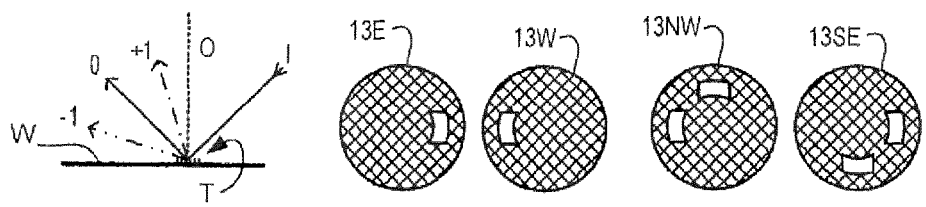
FIG. 6B schematically depicts a detail of a diffraction spectrum of a target periodic structure for a given direction of illumination.
FIG. 6C schematically depicts illumination apertures for providing further illumination modes in using the inspection apparatus of FIG. 6A for diffraction based measurements.
FIG. 6D schematically depicts further illumination apertures for use in the inspection apparatus of FIG. 6A.

As shown in FIG. 6B, target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitches of the targets and the illumination angles can be designed or adjusted so that the first order rays entering the objective lens are closely aligned with the central optical axis. The rays illustrated in FIGS. 6A and 6B are shown somewhat off axis, purely to enable them to be more easily distinguished in the diagram.

At least the 0 and +1$^{st}$ orders diffracted by the target T on substrate W are collected by objective lens 16 and directed back through optical element 15. Returning to FIG. 6A, both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the inspection apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the periodic structure features as such will not be formed, if only one of the −1$^{st}$ and +1$^{st}$ orders is present.

The particular forms of aperture plate 13 and field stop 21 shown in FIGS. 6A, 6C and 6D are purely examples. In an embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 6A, 6B, 6C or 6D) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure periodic structures oriented in one direction (X or Y depending on the set-up). For measurement of an orthogonal periodic structure, rotation of the target through 90° and 270° might be implemented. Different aperture plates are shown in FIGS. 6C and 6D. The use of these, and numerous other variations and applications of the apparatus are described in the patent application publications mentioned above.

Figure 7:
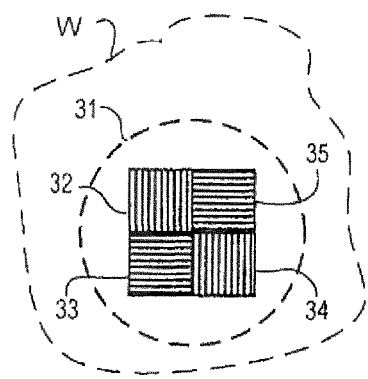
FIG. 7 depicts a form of multiple periodic structure target and an outline of a measurement spot on a target.

FIG. 7 depicts a (composite) target formed on a substrate according to known practice. The target in this example comprises four periodic structures (e.g., gratings) 32 to 35 positioned closely together so that they will all be within a measurement spot 31 formed by the metrology radiation illumination beam of the inspection apparatus. The four periodic structures thus are all simultaneously illuminated and simultaneously imaged on sensors 19 and 23. In an example dedicated to measurement of overlay, periodic structures 32 to 35 are themselves composite periodic structures formed by overlying periodic structures that are patterned in different layers of, e.g., the semi-conductor device formed on substrate W. Periodic structures 32 to 35 may have differently biased overlay offsets in order to facilitate measurement of overlay between the layers in which the different parts of the composite periodic structures are formed. The meaning of overlay bias will be explained below with reference to FIG. 7. Periodic structures 32 to 35 may also differ in their orientation, as shown, so as to diffract incoming radiation in X and Y directions. In one example, periodic structures 32 and 34 are X-direction periodic structures with bias offsets of +d, −d, respectively. Periodic structures 33 and 35 are Y-direction periodic structures with bias offsets +d, −d respectively. Separate images of these periodic structures can be identified in the image captured by sensor 23. This is only one example of a target. A target may comprise more or fewer than 4 periodic structures, or only a single periodic structure.

Figure 8:
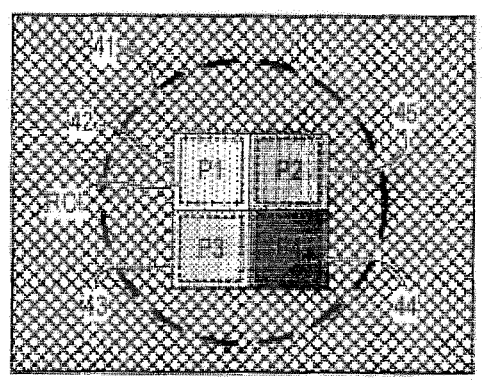
FIG. 8 depicts an image of the target of FIG. 7 obtained in the inspection apparatus of FIG. 6A.

FIG. 8 shows an example of an image that may be formed on and detected by the sensor 23, using the target of FIG. 7 in the apparatus of FIG. 6, using the aperture plates 13NW or 13SE from FIG. 6D. While the pupil plane image sensor 19 cannot resolve the different individual periodic structures 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target periodic structures 32 to 35. If the targets are located in product areas, product features may also be visible in the periphery of this image field. Image processor and control system PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the patterning process. Overlay performance is an important example of such a parameter.

Figure 9:
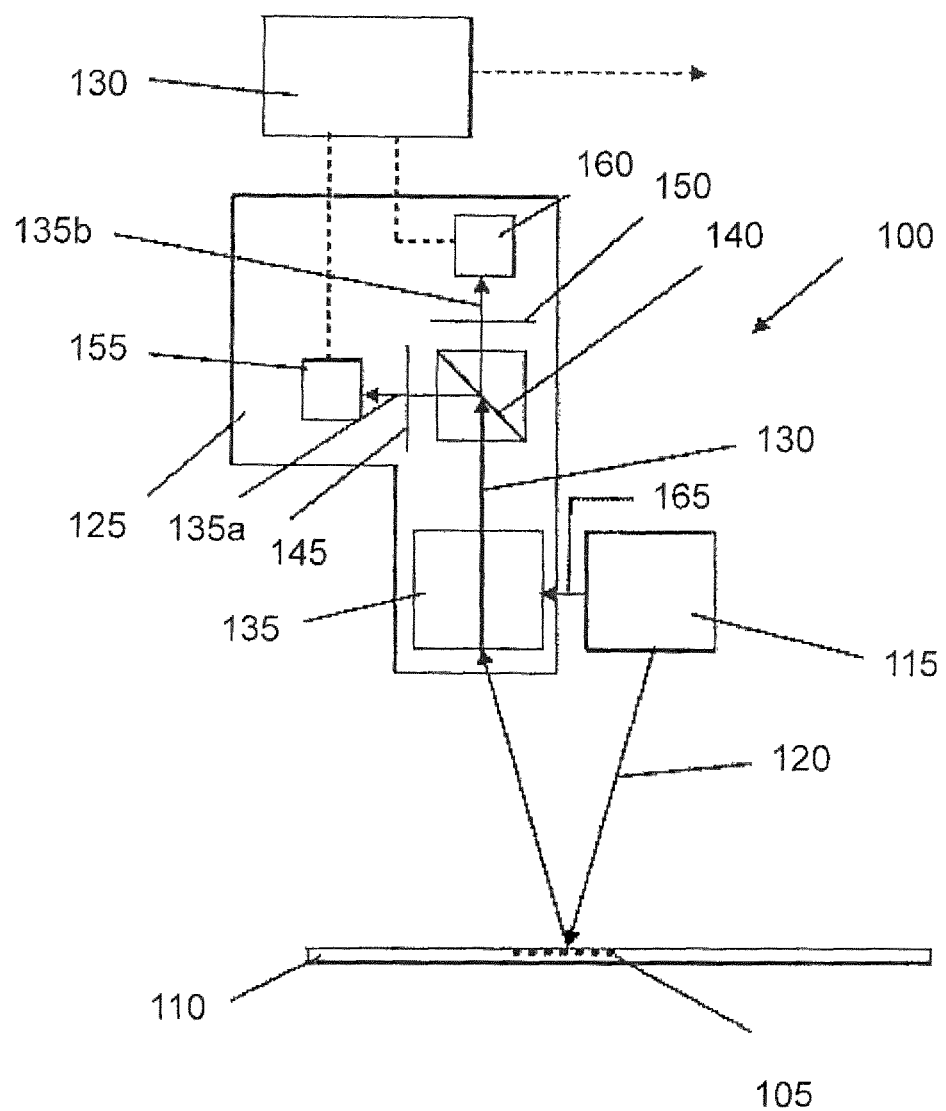
FIG. 9 depicts a schematic diagram of an inspection apparatus in the form of alignment system configured to measure an alignment mark.

Now, FIG. 9 shows an example alignment measurement system, generally indicated by reference numeral 100, to measure an alignment target in the form of an alignment mark 105 (also referred to as a "target") on an object, such as a substrate 110. The alignment measurement system 100 includes an illumination source 115, for instance a laser source, to provide a measurement beam 120, an incident measurement beam, towards the substrate 110, and a detector system 125 to receive the measurement beam 120, a redirected measurement beam, after redirection by the substrate 110.

The alignment measurement system 100 further comprises a processing unit 130 to determine alignment on the basis of the measurement beam 120 redirected by alignment mark 105 and received by the detector system 125. The illumination source 115, the detector system 125, and/or the processing unit 130 may be separate units, or may be integrated in a single unit. The processing unit 130 may be a dedicated processing unit, or may be integrated in another processor of another apparatus, such as a central processing unit of a lithographic apparatus.

In an embodiment, the illumination source 115 provides a measurement beam 120 having a single wavelength. In an embodiment, the illumination source may produce a measurement beam comprising multiple wavelengths, for example "white light", i.e. a mixture of "colors" of the electromagnetic spectrum, including, for example, visible spectra.

The measurement beam 120 may be a polarized or non-polarized beam. In an embodiment, the measurement beam is polarized at a 45 degree angle. This angle may be, for instance, defined with respect to a sub-segmentation direction in the alignment mark, the scan direction, the stage orthogonal system, or any other suitable reference. The measurement beam 120 may be a pulsed or a continuous beam.

The detector system 125 comprises an interferometer unit 135, wherein the redirected measurement beam 120 is joined with a reference beam 165 resulting in a combined measurement beam 130 having intensity variations representative for the measurement of the alignment mark 105. Interferometer units, such as interferometer unit 135, are known even though the application of such an interferometer unit as described herein is different than a typical application of an interferometer to measure a distance.

The combined measurement beam 130 is guided towards a beam splitting device 140. In the beam splitting device 140, for instance a semi-transparent minor, the combined measurement beam 130 is split into a first measurement beam part 135a and a second measurement beam part 135b. The first measurement beam part 135a is guided to a first polarizing device 145 configured to change the polarizing angle from 45 degrees to 0 degrees, while the second measurement beam part 135b is guided to a second polarizing device 150 configured to change the polarization angle from 45 degrees to 90 degrees. The first and second polarizing devices 145, 150 may be, for instance, formed by two quarter wave plates having opposed polarization. From the first polarizing device 145 the first measurement beam part 135a is guided to a first detector 155, and from the second polarizing device 150 the second measurement beam part 135b is guided to a second detector 160. The first detector 155 provides a first detection signal on the basis of the first measurement beam part 135a received by the first detector 155. The second detector 160 provides a second detection signal on the basis of the second measurement beam part 135b received by the second detector 160.

The processing unit is configured to determine alignment of the alignment mark 105 on the basis of intensity variations in the first detection signal and/or the second detection signal.

An example possible advantage of the split-up of the measurement beam in two measurement beam parts with different polarizations, is that by comparison of the first and the second detection signals, for instance by subtracting the first and second detection signals, the noise induced by layers on the substrate other than the layer(s) of the alignment mark 105 may be eliminated. For example, a substrate 110 can comprise a plurality of layers of material, in one of which is the alignment mark 105. In the measurement beam, noise will be introduced when the measurement beam passes the different layers or is redirected on one of the layers. In different polarization angles within the measurement beam this noise effect will normally be similar. However, when a suitable alignment mark 105 is chosen the effect of the alignment mark 105 on the measurement beam may be different in different polarization directions.

The detection signals provided by the detectors 155, 160 are based on the first and second beam parts having different polarizations. These detection signals are compared with each other in the processing unit, for instance by subtraction. As a result, the noise levels with substantially the same level in both beam parts, i.e. the noise level caused by the different layers will be cancelled or at least substantially reduced. In contrast, the intensity variations due to the redirection by the alignment mark 105 of the measurement beam parts with different polarizations as received by the first detector 155 and the second detector 160 will have different values. Comparison, for example by subtracting of the detection signals will not result in cancelling of the detection signals, but in a signal representative for alignment of the alignment mark 105. On the basis of this signal the alignment of the substrate may be determined.

The polarization directions of the first and second measurement beam parts can be chosen to have a desired (e.g., optimal) difference between the signals. In an embodiment, one measurement beam part is polarized to a beam part with a transverse-magnetic (TM) wave, also indicated as having a p-like electric field, or as p-polarized or tangential plane polarized, and the other measurement beam part is polarized to a beam part with a transverse-electric (TE) wave, also indicated as having a s-like electric field, or as s-polarized or sagittal plane polarized.

In order to obtain proper results, a sub-segmented alignment mark could be used that provides sufficiently high signal differences between the two polarizations. In an embodiment, such an alignment mark 105 may comprise lines with a dense sub-segmentation in one direction in combination with not-sub-segmented spaces. For instance, for a certain phase depth, the contrast of an alignment mark is determined by, e.g., the difference in reflectivity between line and space of the alignment mark 105. The reflectivity of a sub-segmented grating varies with changing duty cycle of the sub-segmentation. If an alignment mark 105 is made with, e.g., a duty cycle of 0% in the spaces, and about 25% in the lines, the TM polarization radiation will yield almost no alignment signal. But, the alignment signal for TE polarization will be significant, because of the large difference between line and space.

An additional or alternative possible advantage of the use of at least two different polarizations is that noise of the illumination source 115 can be substantially eliminated. If the illumination source 115 produces a measurement beam, for instance a polarized beam under a single angle of, for example, 45 degrees, with a certain noise level, the measurement beam will be decoupled into two measurement beam parts with different polarizations. Noise induced by the illumination source 115 will thus end up at a similar level in both the first and the second measurement beam parts. As a consequence, this noise term can be eliminated or at least substantially reduced by subtraction or another comparison method of measurement signals obtained from the first and second measurement beam parts.

Furthermore, while the creation of the two different polarizations in the embodiment of FIG. 9 is accomplished by an example structure comprising the beam splitting device 140 and the first and second polarizing devices 145, 150, the creation of the two different polarizations can be accomplished by a different example structure. In particular, one such structure involves a polarizing beam splitting surface which permits substantially only a certain polarization to pass through and reflects another polarization. An example of such a structure with a polarizing beam splitting surface is schematically depicted in FIG. 10.

Figure 10:
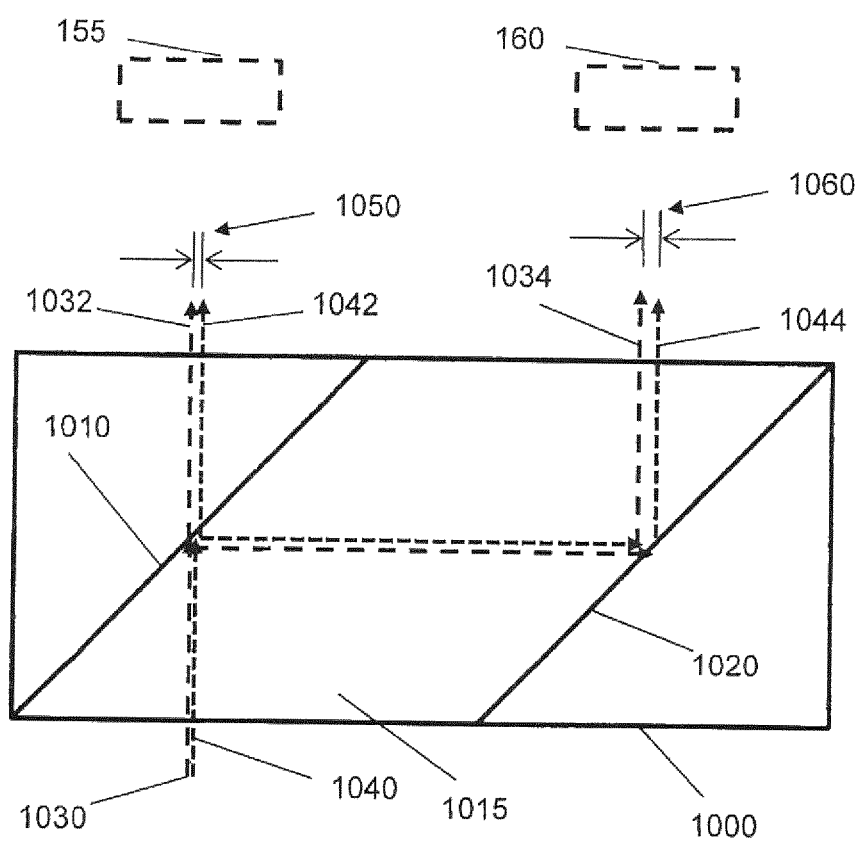
FIG. 10 schematically depicts an example polarizing beam splitter that could be used in an apparatus such as an inspection apparatus as depicted in FIGS. 3, 4 and 9.

FIG. 10 schematically depicts an example polarizing beam splitter 1000 that could be used in an inspection apparatus as depicted in FIGS. 3, 4 and 9. In an embodiment of this splitter, there are provided at least two polarizing beam splitting surfaces, each of which permits substantially only a certain polarization to pass through and reflects another polarization. In an embodiment, each of the polarizing beam splitting surfaces 1010, 1020 comprise an optical thin film coating comprising a stack of thin film layers.

In an embodiment, the polarizing beam splitter 1000 comprises a first polarizing beam splitting surface 1010 and a second polarizing beam splitting surface 1020. In an embodiment, a single polarizing beam splitting surface can be provided (e.g., the polarizing beam splitter can be in the form of beam splitter 140 as depicted in FIG. 9 in which the splitting surface shown is a polarizing beam splitting surface). So, in the embodiment of FIG. 10, the second polarizing beam splitting surface 1020 need not be a splitting surface and may not change polarization of the radiation.

In the splitter 1000, an entering beam 1030 (e.g., beam 130 of FIG. 9) is incident on polarizing beam splitting surface 1010, which splits the beam into components 1032 and 1034. In an embodiment, the entering beam 1030 is, e.g., radiation polarized at 45 degrees or is unpolarized radiation. The component 1032 transmitted through the polarizing beam splitting surface 1010 comprises substantially only p polarized radiation while component 1034 reflected by the polarizing beam splitting surface 1010 comprises substantially only s polarized radiation. The component 1032 is directed toward a sensor (such as detector 155 of FIG. 9 shown in dashed lines as a non-limiting example). The reflected component 1034 travels from the polarizing beam splitting surface 1010 to the polarizing beam splitting surface 1020. Like polarizing beam splitting surface 1010, polarizing beam splitting surface 1020 reflects substantially only s polarized radiation. Thus, a more pure s polarized radiation beam can be provided toward a sensor (such as detector 160 of FIG. 9 shown in dashed lines as a non-limiting example). P polarized radiation in component 1034 as it is incident on polarizing beam splitting surface 1020 can pass through to, e.g., a beam dump. While FIG. 9 shows two sensors, the sensor can be single sensor with different regions to measure the radiation. Furthermore, the radiation with two different polarizations is shown as coming out of the splitter 1000 in a same direction on a same side. This need not be the case. Radiation with a first polarization can come out of a different surface than radiation with a second different polarization, similar to, e.g., the arrangement of FIG. 9.

For an optical thin film coating such as for polarizing beam splitting surface 1010 and/or 1020, different wavelengths have different effective penetration depth based on the thin film stack design of the coating and the angle of incidence of the radiation on the thin film stack. This translates, at least to the first order, into an image offset after reflection from the thin film coating and which image offset can be different for different polarizations. An example of this is schematically depicted in FIG. 9 wherein radiation 1030 has a first wavelength and radiation 1040 has a second different wavelength. In the splitter 1000, the entering beam 1040 is incident on polarizing beam splitting surface 1010, which splits the beam into components 1042 and 1044. In an embodiment, the entering beam 1040 is, e.g., radiation polarized at 45 degrees or is unpolarized radiation. The component 1042 transmitted through the polarizing beam splitting surface 1010 comprises substantially only p polarized radiation while component 1044 reflected by the polarizing beam splitting surface 1010 comprises substantially only s polarized radiation. The component 1042 is directed toward a sensor. The reflected component 1044 travels from the polarizing beam splitting surface 1010 to the polarizing beam splitting surface 1020. Like polarizing beam splitting surface 1010, polarizing beam splitting surface 1020 reflects substantially only s polarized radiation. Thus, a more pure s polarized radiation beam can be provided toward a sensor. However, radiation 1040 (and its components 1042 and 1044) with a different wavelength than radiation 1030 (and its components 1032 and 1034) has different effective penetration depth than radiation 1030 and results in an image offset for the position of the component 1042 relative to the position of the component 1032 as shown by 1050. Similarly, there is an image offset for the position of the component 1044 relative to the position of the component 1034 as shown by 1060.

Figure 11:
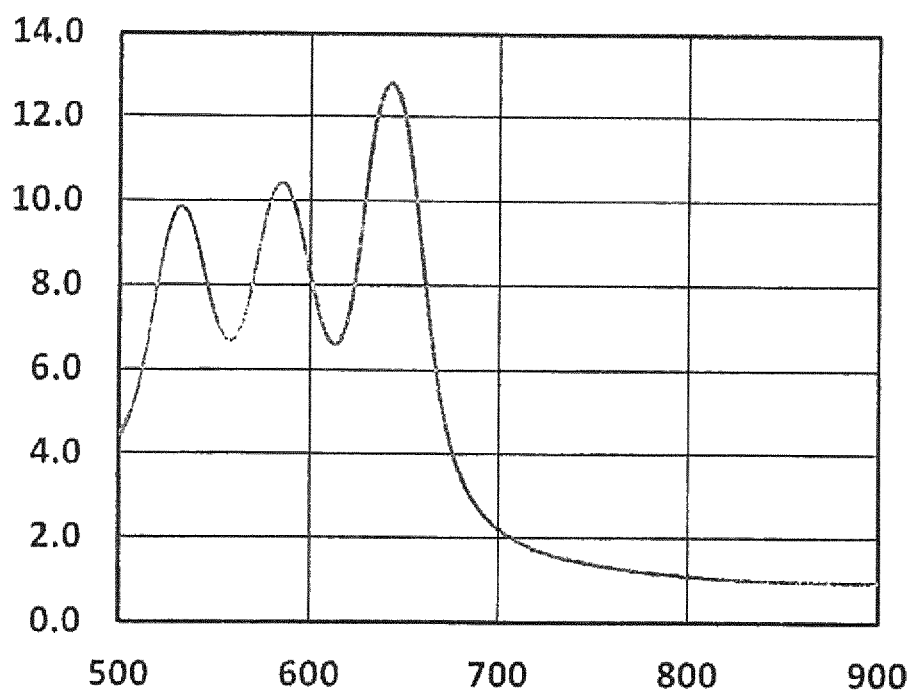
FIG. 11 is a graph of chromatic offset against wavelength of radiation incident on an example polarizing coating.

While an image offset may not pose a serious problem where the beam width is of the order of hundreds of microns and the image offset is of the order of tens of microns or less, in some applications, a goal is to reach sub-nanometer measurement (e.g., alignment) accuracy, where such an offset may play a role. For example, even for relatively small beam angle variations of +/−1 degree around a nominal angle of incidence, an image offset can be ten times the desired accuracy after reflection from a polarizing surface coating that is designed without consideration to this effect. Further, the image offset can have a quite large variation (e.g., from 0 to 20 microns) over the range of wavelengths used in an inspection apparatus having a polarizing coating optimized only for extinction ratio (e.g., the ratio of the irradiance of the undesired mode of polarization to that of the desired). As an example, a chromatic offset from a coating designed with only extinction ratio as the main consideration can be as high as 12 microns for certain wavelengths as shown in FIG. 11 (which a graph of chromatic offset in microns along the vertical axis versus wavelength in nanometers along the horizontal axis), which shows that the chromatic offset can be more than 12 microns for the wavelength range of about 640 nm to 650 nm and can be significant for wavelengths from 500 nm to about 750 nm.

Accordingly, embodiments herein focus on configuration of the coating(s) to reduce the image offset. Since the image offset depends on wavelength, it is referred to herein as a chromatic offset. The chromatic offset is different for different polarizations. Thus, for example, the chromatic offset for p polarization is different from s polarization. The embodiments herein focus on the polarized radiation which is predominantly reflected from the polarizing coating, which in an embodiment is s polarized radiation. The chromatic offset for the coating can depend on the order of thin film layers in the stack and can be different for forward and reverse directions through the coating for an asymmetrical coating stack. Moreover, the chromatic offset for the polarized radiation that transmits through the coating tends to be smaller than for the polarized radiation that is reflected. So, the embodiments herein focus on the configuration of the coating for the polarized radiation which reflects from the coating, since that radiation typically has a chromatic offset with a large wavelength dependency and larger magnitude compared to the chromatic offset of the polarized radiation that transmits through the coating. But, the configurations of the coating described herein can additionally or alternatively be focused on reducing the chromatic offset for polarized radiation which transmits through the coating.

To the first order, chromatic offset $x_1$ is given by $$x_1 = \lambda/(2\pi n) * d\phi(\lambda)/d\Theta \tag{1}$$

where $\lambda$ is the wavelength of the radiation in vacuum, n is the refractive index, and $d\phi(\lambda)/d\Theta$ is the wavelength derivative of the reflection or transmission phase $\phi$ for the polarization under consideration with respect to angle of incidence $\theta$ of the radiation. Thus, as identified above for a particular polarization under consideration, the chromatic offset is dependent on the wavelength of the radiation, the refractive index of the polarizing coating and the angle of incidence. So, desirably for a particular wavelength and polarization, there is identified an appropriate refractive index and angle of incidence to enable reduction or minimization of the chromatic offset.

So, in an embodiment, a relatively simple quarter wave stack can be used, such as $(HL)^n$ wherein H is a quarter wave thickness of a high refractive index material, L is a quarter wave thickness of a low refractive index material, and ^n represents the n number of repetitions of the combination of layers H and L (e.g., $(HL)^5$ is a stack comprising 5 repetitions of the combination of layers H and L). In an embodiment, the inspection apparatus can use a relatively wide wavelength range of measurement radiation (e.g., radiation selected from the range of about 300 nm-about 1100 nm (or any range there within) such as about 400 nm-about 1000 nm or about 500 nm-about 900 nm). So, the quarter wave thickness is defined in terms of a center wavelength of the range of wavelengths or an adjusted center wavelength where the incident is non-normal. In an embodiment, the adjusted center wavelength is a center wavelength of the range of wavelengths of interest at a nominal incidence angle divided by cosine of the incident angle to the stack (e.g., the incident angle in a substrate interfacing the stack) to account for a non-normal angle of incidence. For example, for a wavelength range of about 500 nm to 900 nm and an incident angle to the stack of 49 degrees, a center wavelength is about 700 nm and the adjusted wavelength is about 1066 nm. In an embodiment, the center wavelength is a harmonic mean of the wavelength range (which is then adjusted where the incident angle in the substrate is non-normal). So, the quarter wave thickness is defined as ((adjusted) center wavelength/4/refractive index at the (adjusted) center wavelength).

A quarter wave stack, such as $(HL)^n$, designed to be a polarizing coating may not be sufficient to achieve a good extinction ratio and low chromatic offset over the wavelength range. Adding more layers and optimizing with commercial software may not help either since commercial software typically does not provide an option to optimize for $d\phi(\lambda)d\Theta$; while phase derivatives with respect to wavelength can be investigated in such software, they may not be investigated with respect to angle of incidence, which is significant in the present situation.

It has been discovered that a MacNeille-type beam splitter coating can provide a minimum chromatic offset in reflection for s polarization and a largest possible wavelength range for a given angle of incidence once the coating materials (e.g., of the polarizing surface 1010 and/or 1020) and the material of the substrate (e.g., solid 1015) that interfaces with the coating are chosen.

In an embodiment, such a thin film coating comprises alternating layers of two coating materials, which thin film is enclosed within a substrate on both sides. In an embodiment, the substrate is of the same material on both sides or is of different material. While the description herein focuses on the substrate that couples the incident radiation onto the coating, the substrate that transmits the polarization that passes through the coating can be also be selected.

The thickness of alternating layers of material of the MacNeille-type polarizing thin film coating with refractive indices $N_1$ and $N_2$ is respectively essentially:

$(N_1^2+N_2^2)^{1/2}/_1^2$ times the quarter wave thickness of a layer with refractive index $N_1$ (2)

$(N_1^2+N_2^2)^{1/2}N_2^2$ times the quarter wave thickness of a layer with refractive index $N_2$ (3)

Figure 12:
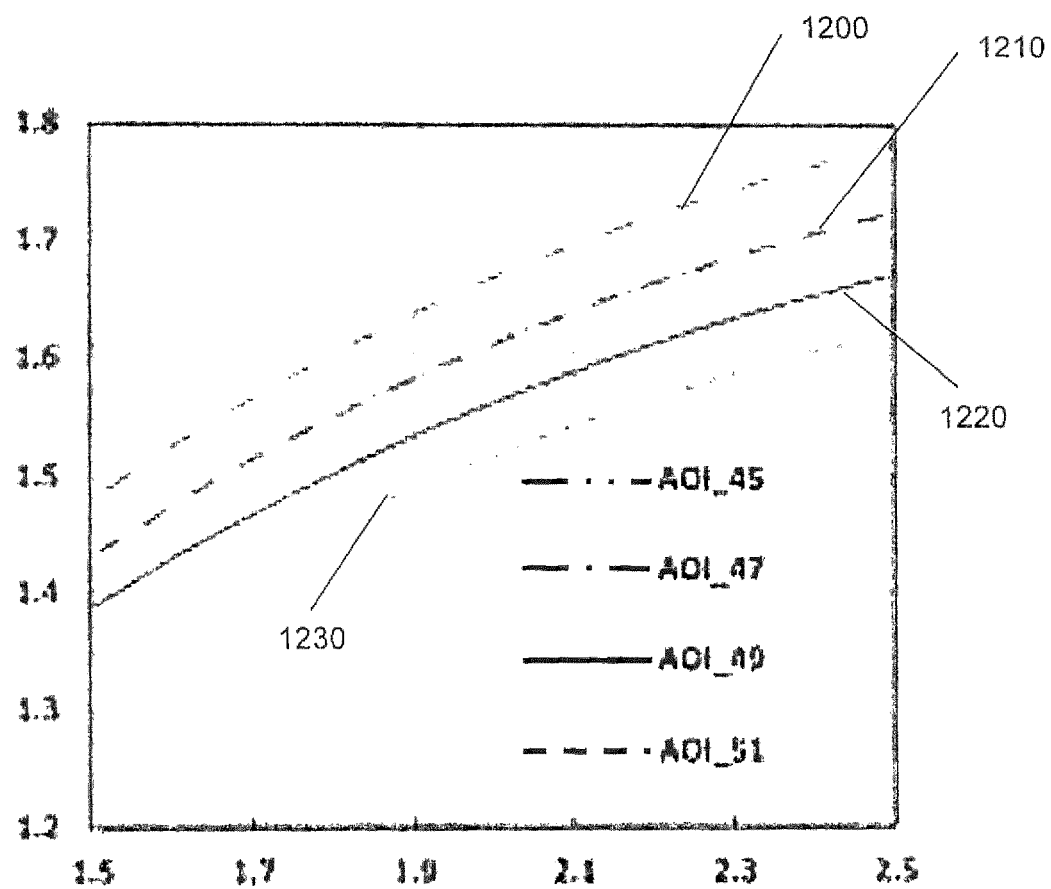
FIG. 12 is a graph of refractive index of a substrate against the refractive index of a layer of a polarizing coating interfacing with the substrate for a plurality of incident angles within the substrate.

Further, the best extinction ratio is achieved when the refractive index of the substrate (e.g., solid 1015) is equal to:

$N_1N_2/(N_1^2+N_2^2)^{1/2}/\sin(\gamma)$ (4)

where $\gamma$ is the angle of incidence in the substrate. And, the angles of incidence and refraction within the coating materials are chosen as $\tan(\alpha)=N_2/N_1$ and $\tan(\beta)=N_1/N_2$, wherein $\alpha$ is the angle of incidence within the layer $N_1$ and $\beta$ is the angle of refraction from the layer having $N_1$ into layer having $N_2$. So, the choice of $N_1$, $N_2$ can determine the choice of the substrate and the angle of incidence for the coating or vice versa. In an embodiment, the materials corresponding to $N_1$ and $N_2$ are dielectric materials. The relationship between $N_1$, the refractive index of the substrate, and the angle of incidence in the substrate is shown in FIG. 12. In FIG. 12, the refractive index $N_1$ is along the horizontal axis, the refractive index of the substrate is along the vertical axis, and line 1200 corresponds to an incident angle of 45 degrees, line 1210 corresponds to an incident angle of 47 degrees, line 1220 corresponds to an incident angle of 49 degrees and line 1230 corresponds to an incident angle of 51 degrees. In this case, $N_2$ is fixed at 1.46 for simplicity and corresponds to $SiO_2$ (quartz), a common low refractive index material used for a coating.

So, using FIG. 12 or data corresponding to FIG. 12 or a function representing data in FIG. 12, a refractive index of the substrate can be identified for a particular incident angle or a particular incident angle can be identified for a particular refractive index of the substrate. As an example, if $N_1=2.39$ and $N_2=1.46$ are selected, a refractive index of the substrate should be about 1.65 for a selected 49 degree angle of incidence in the substrate. In this example, the chosen $N_1$ and $N_2$ correspond to niobium oxide and $SiO_2$ respectively while the optical substrate of refractive index close to 1.65 can be Schott's SF2 optical glass. With these various refractive indices and the incident angle, the ratio of the layer thicknesses is 0.490H:1.314L, wherein H and L are the quarter wave thickness of the materials corresponding to $N_1$ and $N_2$ respectively at an adjusted center wavelength of the wavelength range (e.g., about 1020 nm in this example). So, in this example, the actual thickness of the high refractive index material layer corresponding to $N_1$ can be calculated as 0.490H=0.490*(adjusted) center wavelength (e.g., 1020 nm)/4/(refractive index of the H material, namely $N_1$, at the (adjusted) center wavelength).

The combination of layers (0.490H 1.314L) is repeated a plurality of times to obtain the desired extinction ratio and/or chromatic offset. A software optimization can be used to select the number of repetitions of the combination of layers to obtain an extinction ratio and/or chromatic offset that meets or crosses a threshold. In an embodiment, the extinction ratio is at least about 100, at least about 150, at least about 200, at least about 500 or at least about 1000. In an embodiment, the chromatic offset is less than or equal to 10 microns, is less than or equal to 5 microns, is less than or equal to 3 microns, is less than or equal to 2 microns, or less than or equal to 1 micron.

While the combination of layers above refers to two materials, it will be appreciated that more than 2 materials can be used in a combination of layers (e.g., there can be three layers in a particular combination, wherein each layer is of a different material). Moreover, different combinations of different materials can be used, examples of which are described further below.

In an embodiment, the wavelength range over which a desired high extinction ratio is achieved can be increased or the desired high extinction ratio of a certain wavelength range can be increased, by adding repetitions of a different combination of layers. In an embodiment, the different combination of layers uses the same materials as a base combination of layers but has a different thickness of one or more of the layers in the different combination. In an embodiment, the different combination is a multiple (including a real number multiple such as a whole number multiple) of a base combination of layers of the coating. In order to reduce or minimize the effect of the phase after reflection, the combination of layers with the thicker layers is placed further away from the coating surface receiving the incident radiation (e.g., towards a bottom where the coating is a the top) so that the layers which the radiation encounters first determine the phase response and the chromatic offset while the layers further away from those layers that encounter the radiation first are used to achieve better extinction for longer wavelengths. Placing a thicker stack on the top may produce an unfavorably large chromatic offset at certain wavelengths. So, a stack of multiple different combinations of layers can produce a better response for both extinction ratio and chromatic offset over a wavelength range compared to a stack having a single combination (that is repeated) of the same materials as used in the stack of multiple different combinations of layers.

So, the coating which has repeating layers with different combinations of layers (where each combination has the same film materials) can be expressed as, e.g., (aH bL)^n(cH dL)^m eH fL . . . , where a, b, c, d, e, f . . . are real numbers, n and m are whole numbers and represent the number of repetitions of the associated combination of layers in the coating, and H and L refer to the quarter wave thicknesses of the high refractive index material and low refractive index material respectively (and refer to a same (adjusted) center wavelength). The layer eH and/or fL can be added as appropriate to, e.g., provide symmetry of the stack and/or to reduce the effect of phase. A software optimization can be used to adjust one or more of the coefficients a, b, c, d, e, f . . . , adjust the values of n and/or m, adjust whether to include the layer eH and/or fL, and/or adjust the (adjusted) center wavelength in order to obtain a desired chromatic offset and/or a desired extinction ratio.

As an example, a coating with two stacks of a combination of layers can be designed as follows: (0.94464H 2.51904L)^5(0.560142H 1.493712L)^5 0.560142H where H is the quarter wave thickness of niobium oxide at an adjusted center wavelength of 1020 nm and L is the quarter wave thickness of silicon dioxide at the adjusted center wavelength of 1020 nm. Further, the substrate can be SF2 optical glass and the angle of incidence in the substrate material (SF2) on the first layer is 49 degrees. In this embodiment, the thicker stack of (0.94464H 2.51904L)^5 is located away from the surface that first receives the incident radiation. This embodiment is based on the example above using the combination of films (0.490H 1.314L) in that the ratio of the thicknesses of the films in the combination (0.94464H 2.51904L) and in the combination (0.560142H 1.493712L) is substantially the same as the ratio of the thicknesses of the films in the combination (0.490H 1.314L).

Figure 13:
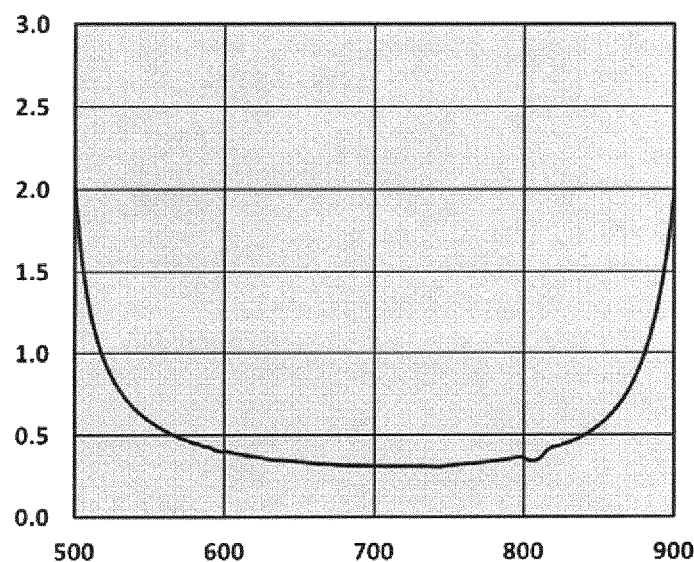
FIG. 13 is a graph of chromatic offset against wavelength of radiation incident on a coating according to an embodiment.
Figure 14:
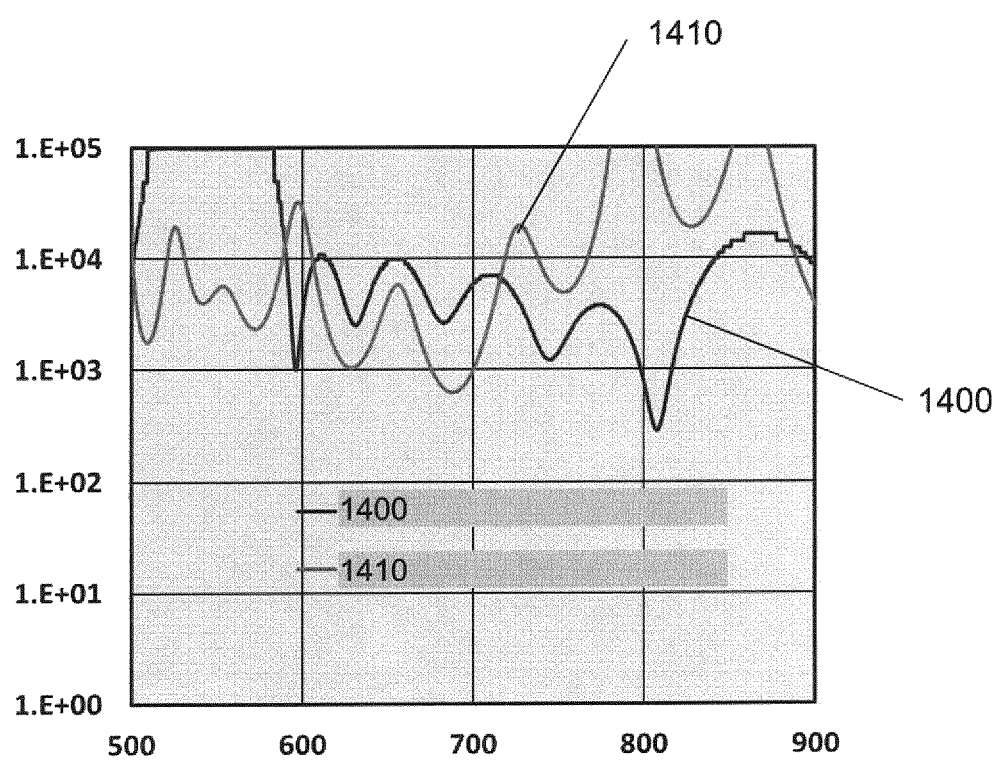
FIG. 14 is a graph of reflection and transmission extinction ratios against wavelength of radiation incident on a coating according to an embodiment.

Referring to FIGS. 13 and 14, the coating design above with the two stacks used for a polarizing beam splitter shows good chromatic offset for a s polarized reflected beam of less than 2 microns and an extinction ratio of better than 200 for all the wavelengths in the range of 500 to 900 nm. FIG. 13 is a graph of chromatic offset in microns along the vertical axis against wavelength in nanometers of radiation incident on the coating according to this embodiment along the horizontal axis. As seen in FIG. 13, the chromatic offset is less than 2 microns across the wavelength range from 500 to 900 nm. Further, FIG. 14 is a graph of reflection and transmission extinction ratios along the vertical axis against wavelength in nanometers of radiation incident on a coating according to this embodiment along the horizontal axis. As seen in FIG. 14, the transmission extinction ratio 1400 and the reflection extinction ratio 1410 are both greater than about 200 across the wavelength range from 500 to 900 nm.

In an embodiment, two or more polarizing coatings are provided, wherein a first multilayer polarizing coating provides a first chromatic offset in a first direction or orientation (e.g., angle) and a second multilayer polarizing coating provides a second chromatic offset in a second direction or orientation different from the first direction so that the combined chromatic offset of the first and second chromatic offsets is less the first and second chromatic offsets. In an embodiment, the second direction is essentially opposite to the first direction or orientation. In an embodiment, the first and/or second multilayer polarizing coating is a MacNeille-type multilayer polarizing coating. So, in an embodiment, complementary coatings with, e.g., essentially opposite phase characteristics are provided in a periscope type arrangement (e.g., like the optical element of FIG. 10) so that a first reflection moves the image a first direction or orientation (e.g., to the right) and the second reflection moves the image in a second direction or orientation (e.g., to the left) such the net chromatic offset is less than the chromatic offset after the first reflection or the second reflection (e.g., by the second reflection having a chromatic offset to the left by a same or close to same (e.g., within plus or minus 15%, within plus or minus 10%, or within plus or minus 5%) amount as the chromatic offset of the first reflection was to the right).

So, as a review, optical images can be altered/distorted by both amplitude and phase changes upon reflection from optical interfaces. The alteration is a function of wavelength, angle of incidence, and polarization. The alteration is typically smaller than the traditional optical diffraction-limited resolution. Nevertheless, the alteration can be significant in sub-diffraction instrumentation such as an alignment sensor. In particular, there can be a variation as a function of angle which can be significant because an image will contain a range of angles. As an example, a pupil plane image can be displaced from the expected location when the s polarization image component is reflected 45 degrees twice in a periscope-like geometry as depicted in FIG. 10. Moreover, the displacement can be an undesired function of wavelength. So, while a diffraction limited resolution can be of the order of 500 μm, the image translation can vary by approximately 15 μm or more over a wavelength radiation range of about 500 to about 900 nm, which is significant. So, in an embodiment, there is provided a design of optical coating with controlled phase and/or a reflective geometry to reduce or eliminate the image alteration/translation as a function of wavelength. In particular, in an embodiment, a MacNeille-type polarizing coating is used to provide reduced chromatic offset in a polarizing element in an inspection apparatus (such as an alignment sensor). A MacNeille polarizing coating can be provide an advantage as far as chromatic offset is concerned at least for s polarization. In addition or alternatively, a reflective geometry can be provided to provide a first chromatic offset that compensates for a second chromatic offset to provide a net reduced chromatic offset.

The coating(s) and/or reflective geometry described herein can have various applications. For example, it can be applied to an optical element that is part of, or provided in or with, a lithographic apparatus (including any optical metrology apparatus therein such as the alignment sensor AS, level sensor LS, interferometer IF, etc.) as described herein, an inspection apparatus as described herein (such as any of the elements of FIGS. 3, 4 and 6), any articles for use with any of the apparatus described herein. So, in an embodiment, the coating(s) and/or reflective geometry can be provided to a DUV and/or EUV alignment sensor, an optical level sensor, DUV and/or EUV illumination and/or projection optics, etc. While the description has focused on use of coatings in a patterning process or any of its related apparatuses, it will be appreciated that the coatings described herein can be used for other applications and thus the coatings should not considered as limited to being used for structures used in a patterning process or any of its apparatuses. Further, while the description has focused on the use of a coating to help provide reduced chromatic offset, the coatings described herein can have other purposes and so the coatings herein are not limited merely to the purposes of providing reduced chromatic offset.

In an embodiment, there is provided an inspection apparatus, comprising: an optical system configured to provide a beam of radiation to a surface to be measured and to receive redirected radiation from the surface; and a detection system configured to measure the redirected radiation, wherein the optical system comprises an optical element to process the radiation, the optical element comprising a MacNeille-type multilayer polarizing coating configured to produce a reduced chromatic offset of the radiation.

In an embodiment, the polarizing coating produces a chromatic offset of less or equal to 10 microns over at least the radiation wavelength range of 500 nm to 900 nm. In an embodiment, the polarizing coating produces an extinction ratio of at least 100 over at least the radiation wavelength range of 500 nm to 900 nm. In an embodiment, the polarizing coating comprises a first stack of a repeating combination of layers and a second stack of a repeating combination of layers, wherein a thickness of at least one of the layers in the second stack is different than the thicknesses of the individual layers in the first stack. In an embodiment, the materials of the layers of the first stack are the same materials as the layers of the second stack. In an embodiment, a ratio of the thicknesses of the layers of the combination repeated in the second stack is a multiple of a ratio of the thicknesses of the layers of the combination repeated in the first stack. In an embodiment, the polarizing coating further comprises a layer of material of the same material as a layer of the first stack and abutting the first stack to have a symmetrical arrangement of layers of that material of the first stack and/or a layer of material of the same material as a layer of the second stack and abutting the second stack to have a symmetrical arrangement of layers of that material of the second stack. In an embodiment, the first stack has the combination of layers with a greater thickness than the combination of layers of the second stack and the first stack is further away from the surface of the coating that first receives the radiation than the second stack. In an embodiment, the optical element comprises a further multilayer polarizing coating, wherein the MacNeille-type multilayer polarizing coating provides a first chromatic offset in a first direction or orientation and the further multilayer polarizing coating provides a second chromatic offset in a second different direction or orientation so that the combined chromatic offset of the first and second chromatic offsets is less the first and second chromatic offsets.

In an embodiment, there is provided a measurement method, the method comprising: providing a beam of radiation to a surface to be measured and receiving redirected radiation from the surface, wherein the radiation is processed using an optical element comprising a MacNeille-type multilayer polarizing coating configured to produce a reduced chromatic offset of the radiation; and detecting the redirected radiation to obtain a measurement.

In an embodiment, the polarizing coating produces a chromatic offset of less or equal to 10 microns over at least the radiation wavelength range of 500 nm to 900 nm. In an embodiment, the polarizing coating produces an extinction ratio of at least 100 over at least the radiation wavelength range of 500 nm to 900 nm. In an embodiment, the polarizing coating comprises a first stack of a repeating combination of layers and a second stack of a repeating combination of layers, wherein a thickness of at least one of the layers in the second stack is different than the thicknesses of the individual layers in the first stack. In an embodiment, the materials of the layers of the first stack are the same materials as the layers of the second stack. In an embodiment, a ratio of the thicknesses of the layers of the combination repeated in the second stack is a multiple of a ratio of the thicknesses of the layers of the combination repeated in the first stack. In an embodiment, the polarizing coating further comprises a layer of material of the same material as a layer of the first stack and abutting the first stack to have a symmetrical arrangement of layers of that material of the first stack and/or a layer of material of the same material as a layer of the second stack and abutting the second stack to have a symmetrical arrangement of layers of that material of the second stack. In an embodiment, the first stack has the combination of layers with a greater thickness than the combination of layers of the second stack and the first stack is further away from the surface of the coating that first receives the radiation than the second stack. In an embodiment, the optical element comprises a further multilayer polarizing coating, wherein the MacNeille-type multilayer polarizing coating provides a first chromatic offset in a first direction or orientation and the further multilayer polarizing coating provides a second chromatic offset in a second different direction or orientation so that the combined chromatic offset of the first and second chromatic offsets is less the first and second chromatic offsets.

In an embodiment, there is provided an inspection apparatus, comprising: an optical system configured to provide a beam of radiation to a surface to be measured and to receive redirected radiation from the surface; and a detection system configured to measure the redirected radiation, wherein the optical system comprises an optical element to process the radiation, the optical element comprising a first multilayer polarizing configured to provide a first chromatic offset in a first direction or orientation and a second multilayer polarizing coating configured to provide a second chromatic offset in a second different direction or orientation so that a combined chromatic offset of the first and second chromatic offsets is less the first and second chromatic offsets.

In an embodiment, the first or second polarizing is a MacNeille-type multilayer polarizing coating. In an embodiment, the first direction or orientation is essentially opposite to the second direction or orientation. In an embodiment, the first chromatic offset is essentially the same as the second chromatic offset.

The embodiments may further be described using the following clauses:

1. An inspection apparatus, comprising:
   an optical system configured to provide a beam of radiation to a surface to be measured and to receive redirected radiation from the surface; and
   a detection system configured to measure the redirected radiation,
   wherein the optical system comprises an optical element to process the radiation, the optical element comprising a MacNeille-type multilayer polarizing coating configured to produce a reduced chromatic offset of the radiation.
2. The apparatus of clause 1, wherein the polarizing coating produces a chromatic offset of less or equal to 10 microns over at least the radiation wavelength range of 500 nm to 900 nm.
3. The apparatus of clause 1 or clause 2, wherein the polarizing coating produces an extinction ratio of at least 100 over at least the radiation wavelength range of 500 nm to 900 nm.
4. The apparatus of any of clauses 1-3, wherein the polarizing coating comprises a first stack of a repeating combination of layers and a second stack of a repeating combination of layers, wherein a thickness of at least one of the layers in the second stack is different than the thicknesses of the individual layers in the first stack.
5. The apparatus of clause 4, wherein the materials of the layers of the first stack are the same materials as the layers of the second stack.
6. The apparatus of clause 4 or clause 5, wherein a ratio of the thicknesses of the layers of the combination repeated in the second stack is a multiple of a ratio of the thicknesses of the layers of the combination repeated in the first stack.
7. The apparatus of any of clauses 4-6, wherein the polarizing coating further comprises a layer of material of the same material as a layer of the first stack and abutting the first stack to have a symmetrical arrangement of layers of that material of the first stack and/or a layer of material of the same material as a layer of the second stack and abutting the second stack to have a symmetrical arrangement of layers of that material of the second stack.

8. The apparatus of any of clauses 4-7, wherein the first stack has the combination of layers with a greater thickness than the combination of layers of the second stack and the first stack is further away from the surface of the coating that first receives the radiation than the second stack.

9. The apparatus of any of clauses 1-8, wherein the optical element comprises a further multilayer polarizing coating, wherein the MacNeille-type multilayer polarizing coating provides a first chromatic offset in a first direction or orientation and the further multilayer polarizing coating provides a second chromatic offset in a second different direction or orientation so that the combined chromatic offset of the first and second chromatic offsets is less the first and second chromatic offsets.

10. A measurement method, the method comprising:
providing a beam of radiation to a surface to be measured and receiving redirected radiation from the surface, wherein the radiation is processed using an optical element comprising a MacNeille-type multilayer polarizing coating configured to produce a reduced chromatic offset of the radiation; and
detecting the redirected radiation to obtain a measurement.

11. The method of clause 10, wherein the polarizing coating produces a chromatic offset of less or equal to 10 microns over at least the radiation wavelength range of 500 nm to 900 nm.

12. The method of clause 10 or clause 11, wherein the polarizing coating produces an extinction ratio of at least 100 over at least the radiation wavelength range of 500 nm to 900 nm.

13. The method of any of clauses 10-12, wherein the polarizing coating comprises a first stack of a repeating combination of layers and a second stack of a repeating combination of layers, wherein a thickness of at least one of the layers in the second stack is different than the thicknesses of the individual layers in the first stack.

14. The method of clause 13, wherein the materials of the layers of the first stack are the same materials as the layers of the second stack.

15. The method of clause 13 or clause 14, wherein a ratio of the thicknesses of the layers of the combination repeated in the second stack is a multiple of a ratio of the thicknesses of the layers of the combination repeated in the first stack.

16. The method of any of clauses 13-15, wherein the polarizing coating further comprises a layer of material of the same material as a layer of the first stack and abutting the first stack to have a symmetrical arrangement of layers of that material of the first stack and/or a layer of material of the same material as a layer of the second stack and abutting the second stack to have a symmetrical arrangement of layers of that material of the second stack.

17. The method of any of clauses 13-16, wherein the first stack has the combination of layers with a greater thickness than the combination of layers of the second stack and the first stack is further away from the surface of the coating that first receives the radiation than the second stack.

18. The method of any of clauses 10-17, wherein the optical element comprises a further multilayer polarizing coating, wherein the MacNeille-type multilayer polarizing coating provides a first chromatic offset in a first direction or orientation and the further multilayer polarizing coating provides a second chromatic offset in a second different direction or orientation so that the combined chromatic offset of the first and second chromatic offsets is less the first and second chromatic offsets.

19. An inspection apparatus, comprising:
an optical system configured to provide a beam of radiation to a surface to be measured and to receive redirected radiation from the surface; and
a detection system configured to measure the redirected radiation,
wherein the optical system comprises an optical element to process the radiation, the optical element comprising a first multilayer polarizing configured to provide a first chromatic offset in a first direction or orientation and a second multilayer polarizing coating configured to provide a second chromatic offset in a second different direction or orientation so that a combined chromatic offset of the first and second chromatic offsets is less the first and second chromatic offsets.

20. The inspection apparatus of clause 19, wherein the first or second polarizing is a MacNeille-type multilayer polarizing coating.

21. The inspection apparatus of clause 19 or clause 20, wherein the first direction or orientation is essentially opposite to the second direction or orientation.

22. The inspection apparatus of any of clauses 19-21, wherein the first chromatic offset is essentially the same as the second chromatic offset.

Although specific reference may be made in this text to the use of apparatus for the manufacture of devices, it should be understood that the apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

An embodiment of the invention may take the form of a computer program containing one or more sequences of machine-readable instructions to cause performance of a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implemented in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Although specific reference may have been made above to the use of embodiments in the context of optical system, it will be appreciated that embodiments of the invention may be used in other applications. For example, embodiments may be with imprint lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The present description has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The foregoing description of the specific embodiments reveals the general nature of embodiments of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The descriptions above are intended to be illustrative, not limiting. Thus, it will be apparent to one skilled in the art that modifications may be made to the disclosure as described without departing from the scope of the claims set out below and the breadth and scope of the present invention should not be limited by any of the above-described exemplary embodiments, but should be defined only in accordance with the following claims and their equivalents.

The invention claimed is:

1. An inspection apparatus comprising:
    an optical system configured to provide a beam of radiation to a surface to be measured and to receive redirected radiation from the surface, wherein the optical system comprises an optical element to process the radiation, the optical element comprising a MacNeille multilayer polarizing coating configured to produce a first chromatic offset of the radiation in a first direction and a multilayer polarizing coating configured to produce a second chromatic offset of the radiation in a second direction,
    wherein the combined chromatic offset of the first and second chromatic offsets is less than the first and second chromatic offsets, and
    wherein the first direction is opposite to the second direction; and
    a detection system configured to measure the redirected radiation.

2. The apparatus of claim 1, wherein the MacNeille multilayer polarizing coating is configured to produce a chromatic offset of less or equal to 10 microns over at least the radiation wavelength range of 500 nm to 900 nm.

3. The apparatus of claim 1, wherein the MacNeille multilayer polarizing coating is configured to produce an extinction ratio of at least 100 over at least the radiation wavelength range of 500 nm to 900 nm.

4. The apparatus of claim 1, wherein:
    the MacNeille multilayer polarizing coating comprises a first stack of a repeating combination of layers and a second stack of a repeating combination of layers, and
    wherein a thickness of at least one of the layers in the second stack is different than the thicknesses of the individual layers in the first stack.

5. The apparatus of claim 4, wherein the materials of the layers of the first stack are the same materials as the layers of the second stack.

6. The apparatus of claim 4, wherein a ratio of the thicknesses of the layers of the combination repeated in the second stack, is a multiple of a ratio of the thicknesses of the layers of the combination repeated in the first stack.

7. The apparatus of claim 4, wherein the MacNeille multilayer polarizing coating further comprises a layer of material of the same material as a layer of the first stack and abutting the first stack to have a symmetrical arrangement of layers of that material of the first stack and/or a layer of material of the same material as a layer of the second stack and abutting the second stack to have a symmetrical arrangement of layers of that material of the second stack.

8. The apparatus of claim 4, wherein the first stack has the combination of layers with a greater thickness than the combination of layers of the second stack, and the first stack is further away from the surface of the MacNeille multilayer polarizing coating that first receives the radiation than the second stack.

9. The apparatus of claim 1, wherein the first chromatic offset is essentially the same as the second chromatic offset.

10. A measurement method comprising:
    providing a beam of radiation to a surface to be measured;
    receiving redirected radiation from the surface;
    processing the radiation using an optical element comprising a MacNeille multilayer polarizing coating configured to produce a first chromatic offset of the radiation in a first direction and a multilayer polarizing coating configured to produce a second chromatic offset of the radiation in a second direction,
    wherein the combined chromatic offset of the first and second chromatic offsets is less than the first and second chromatic offsets, and
    wherein the first direction is opposite to the second direction; and
    detecting the redirected radiation to obtain a measurement.

11. The method of claim 10, wherein the MacNeille multilayer polarizing coating produces a chromatic offset of less or equal to 10 microns over at least the radiation wavelength range of 500 nm to 900 nm.

12. The method of claim 10, wherein the MacNeille multilayer polarizing coating produces an extinction ratio of at least 100 over at least the radiation wavelength range of 500 nm to 900 nm.

13. The method of claim 10, wherein
the MacNeille multilayer polarizing coating comprises a first stack of a repeating combination of layers and a second stack of a repeating combination of layers, and
a thickness of at least one of the layers in the second stack is different than the thicknesses of the individual layers in the first stack.

14. The method of claim 13, wherein the materials of the layers of the first stack are the same materials as the layers of the second stack.

15. The method of claim 13, wherein a ratio of the thicknesses of the layers of the combination repeated in the second stack and is a multiple of a ratio of the thicknesses of the layers of the combination repeated in the first stack.

16. The method of claim 13, wherein the MacNeille multilayer polarizing coating further comprises a layer of material of the same material as a layer of the first stack and abutting the first stack to have a symmetrical arrangement of layers of that material of the first stack and/or a layer of material of the same material as a layer of the second stack and abutting the second stack to have a symmetrical arrangement of layers of that material of the second stack.

17. The method of claim 10, wherein the first chromatic offset is essentially the same as the second chromatic offset.

18. An inspection apparatus, comprising:
an optical system configured to provide a beam of radiation to a surface to be measured and to receive redirected radiation from the surface, wherein the optical system comprises an optical element to process the radiation, the optical element comprising a first multilayer polarizing coating configured to provide a first chromatic offset in a first direction or orientation and a second multilayer polarizing coating configured to provide a second chromatic offset in a second direction or orientation so that a combined chromatic offset of the first and second chromatic offsets is less than the first and second chromatic offsets, and
wherein the first direction is opposite to the second direction; and
a detection system configured to measure the redirected radiation.

19. The inspection apparatus of claim 18, wherein the first or second multilayer polarizing coating is a MacNeille multilayer polarizing coating.

20. The inspection apparatus of claim 18, wherein the first chromatic offset is essentially the same as the second chromatic offset.

* * * * *

UNITED STATES PATENT AND TRADEMARK OFFICE
CERTIFICATE OF CORRECTION

PATENT NO. : 11,662,198 B2
APPLICATION NO. : 16/650962
DATED : May 30, 2023
INVENTOR(S) : Kelkar et al.

Page 1 of 1

It is certified that error appears in the above-identified patent and that said Letters Patent is hereby corrected as shown below:

In the Specification

In Column 3, Line 57, after "on" delete "a".

In Column 5, Line 13, delete "minor" and insert -- mirror --, therefor.

In Column 5, Line 16, delete "minors" and insert -- mirrors --, therefor.

In Column 5, Line 24, delete "(minors)" and insert -- (mirrors). --, therefor.

In Column 8, Line 14, delete "minor" and insert -- mirror --, therefor.

In Column 12, Line 48, delete "minor," and insert -- mirror, --, therefor.

In the Claims

In Column 29, Claim 13, Line 1, delete "wherein" and insert -- wherein: --, therefor.

Signed and Sealed this
Eighteenth Day of July, 2023

Katherine Kelly Vidal
*Director of the United States Patent and Trademark Office*